United States Patent
Cole (12)

(10) Patent No.: US 6,721,229 B1
(45) Date of Patent: Apr. 13, 2004

(54) METHOD AND APPARATUS FOR USING SDRAM TO READ AND WRITE DATA WITHOUT LATENCY

(75) Inventor: Philip D. Cole, Redwood City, CA (US)

(73) Assignee: Network Equipment Technologies, Inc., Fremont, CA (US)

(*) Notice: Subject to any disclaimer, the term of this patent is extended or adjusted under 35 U.S.C. 154(b) by 0 days.

(21) Appl. No.: 10/160,664

(22) Filed: May 31, 2002

Related U.S. Application Data

(60) Provisional application No. 60/346,264, filed on Dec. 19, 2001.

(51) Int. Cl.[7] ................................................ G11C 8/00
(52) U.S. Cl. ............................... 365/230.03; 365/230.04
(58) Field of Search ...................... 365/230.03, 230.04, 365/189.04

(56) References Cited

U.S. PATENT DOCUMENTS

| | | | | | |
|---|---|---|---|---|---|
| 5,619,471 | A | * | 4/1997 | Nunziata | 365/230.03 |
| 6,076,136 | A | * | 6/2000 | Burroughs | 365/230.03 |
| 6,397,314 | B1 | * | 5/2002 | Estakhri et al. | 365/230.03 |

* cited by examiner

*Primary Examiner*—Tan T. Nguyen
(74) *Attorney, Agent, or Firm*—Townsend and Townsend and Crew, LLP

(57) ABSTRACT

An apparatus and method are provided for transmitting data using synchronous dynamic random access memory (SDRAM). In example, the method includes writes data using a first set of SDRAM banks. Data is written using a second set of SDRAM banks, wherein the first set of SDRAM banks and the second set of SDRAM banks write interleaved, Data is read using a third set of SDRAM banks. Data is read using a fourth set of SDRAM banks, wherein the fourth set of SDRAM banks and the third set of SDRAM banks read interleaved.

18 Claims, 6 Drawing Sheets

METHOD AND APPARATUS FOR USING SDRAM TO READ AND WRITE DATA WITHOUT LATENCY

This application is related to U.S. patent application Ser. No. 60/346,264, entitled "Method And Apparatus For Using SDRAM To Read And Write Data Without Latency," filed Dec. 19, 2001, which is herein incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention generally relates to space conservation on an integrated circuit board and, more particularly, to using SDRAM to minimize circuitry area and thereby conserve space on an integrated circuit board.

2. Discussion of Background

A common goal of manufacturers of integrated circuits is to make integrated circuits as small as possible. Memory cell buffers account for a substantial portion of the real estate on a circuit board. Accordingly, manufacturers desire high density memory cell buffers. Typically static random access memory (static RAM) is used for these cell buffers. An array of static RAM is easy to design because of the way static RAM works. Static RAM is easy to arrange on the circuit board, and reading and writing with static RAM is easy.

Unfortunately, static RAM is not very dense in comparison to other types of memories, such as synchronous dynamic random access memory (SDRAM). SDRAM is typically between 4 and 16 times the density of static RAM.

However, performing a simple trade of static RAM for SDRAM is not feasible because of the way SDRAM operates. Static RAM and SDRAM read and write data in fundamentally different manners. For example, with SDRAM, a device cannot just determine that it wants particular data "now" from SDRAM. The device must send a request to SDRAM before hand, and the SDRAM must be prepared give the data. Also, when a device writes data to an SDRAM bank, the device must wait awhile before writing more data to the SDRAM bank. SDRAM cannot be written to continuously, unlike static RAM. Further, making a one-for-one trade of static RAM for SDRAM is not feasible because a single SDRAM array would not be fast enough. In comparison to static RAM, one cannot get data out of SDRAM quick enough without making noise.

One attempt to utilize SDRAM has been to make the buses on which the SDRAM communicates wider. More SDRAM can then be used in communication with the bus so that SDRAM can replace what was before static RAM. Attempts have been made to use 64 bit buses, which are wider than normal. However, wider buses are generally a problem. For starters, wider buses take up a lot of real estate on the circuit board. The wide bus and additional SDRAM defeat the purpose of having a higher density circuit board, which is the motivating goal in the first place.

SUMMARY OF THE INVENTION

It has been recognized that what is needed is a memory arrangement that operates at a desired bandwidth and that does not have an oversized bus. Broadly speaking, the present invention fills this need by providing a method and apparatus for transmitting data using synchronous dynamic random access memory (SDRAM) on a normal sized memory bus. It should be appreciated that the present invention can be implemented in numerous ways, including as a process, an apparatus, a system, a device or a method. Several inventive embodiments of the present invention are described below.

In one embodiment, a method is provided for transmitting data using SDRAM. The method comprises writing data using a first set of SDRAM banks; writing data using a second set of SDRAM banks, wherein the first set of SDRAM banks and the second set of SDRAM banks write interleaved; reading data using a third set of SDRAM banks; and reading data using a fourth set of SDRAM banks, wherein the fourth set of SDRAM banks and the third set of SDRAM banks read interleaved.

In another embodiment, an apparatus for transmitting data using synchronous dynamic random access memory (SDRAM), the apparatus comprises a first even addressed SDRAM bank; a second even addressed SDRAM bank, wherein the first even addressed SDRAM bank and the second even addressed SDRAM bank are configured to write in parallel; a first odd addressed SDRAM bank, wherein the first add addressed SDRAM bank and the first even addressed SDRAM bank are configured to write interleaved; and a second odd addressed SDRAM bank, wherein the second odd addressed SDRAM bank and the first odd addressed SDRAM bank are configured to write in parallel, and wherein the second odd addressed SDRAM bank and the second even addressed SDRAM bank are configured to write interleaved.

The invention encompasses other embodiments of a method, an apparatus, and a computer-readable medium, which are configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

DESCRIPTION OF THE PREFERRED EMBODIMENTS

An invention is disclosed for a method and apparatus for using SDRAM to read and write data without latency. Numerous specific details are set forth in order to provide a thorough understanding of the present invention. It will be understood, however, to one skilled in the art, that the present invention may be practiced without some or all of these specific details.

Figure 1:
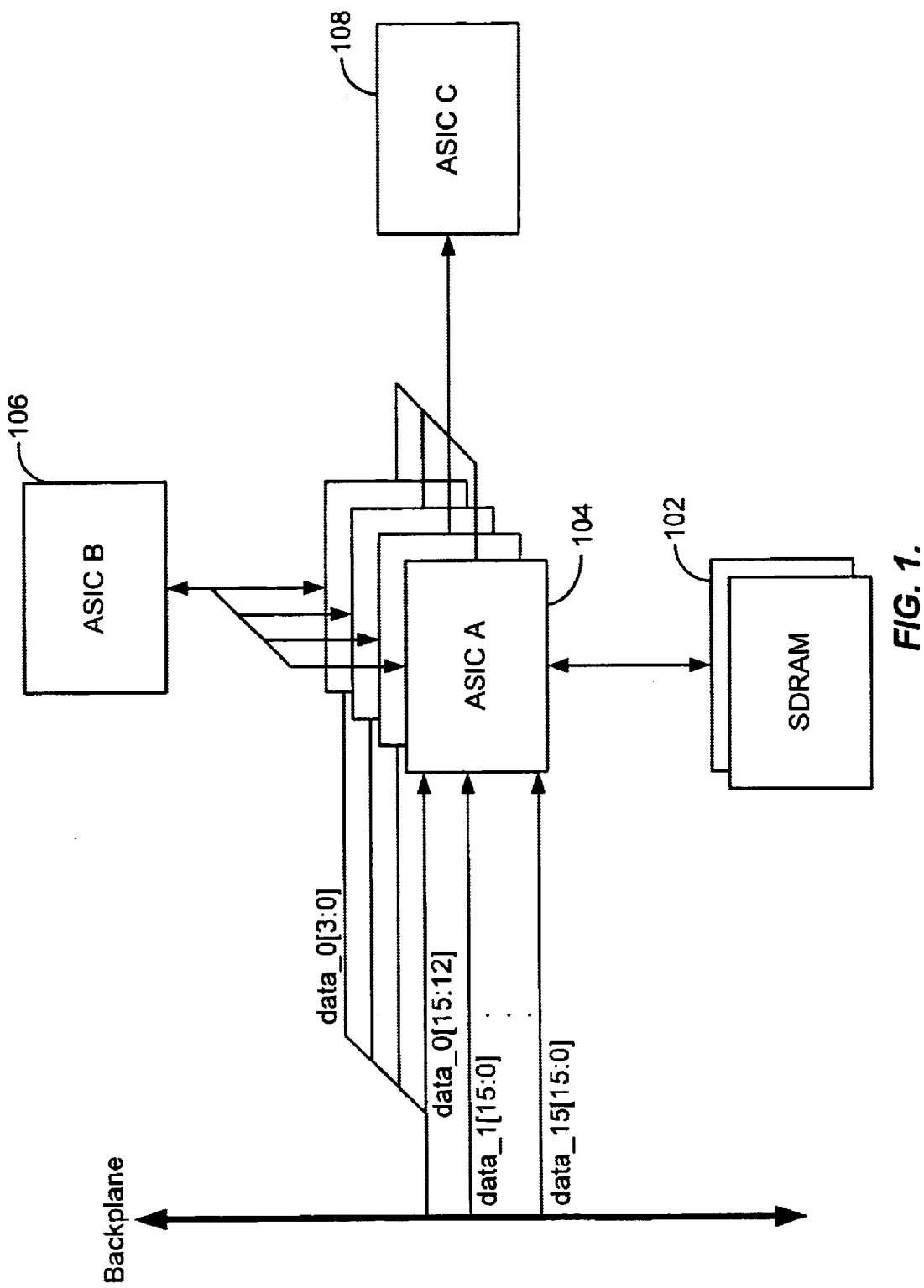
FIG. 1 illustrates an environment in which synchronous dynamic random access memory (SDRAM) operations, in accordance with one embodiment of the present invention.

The list below provides a quick reference to acronyms used in this disclosure.
ATM—asynchronous transfer mode
MTS—main timing sequence
NITS—
Oc—
SDRAM—synchronous dynamic random access memory
SIF—switch interface
SIF1—622 Mbps switch interface card
SIF2—2.4 Gbps switch interface card General Overview FIG. 1 illustrates an environment in which synchronous dynamic random access memory (SDRAM) 102 operations, in accordance with one embodiment of the present inventiond. The SDRAM 102 is in communication with various application specific integrated circuits (ASICs). In this embodiment, the ASICs are named Bertie 104, Filter 106, and Forte 108.

High Level Description

Figure 2:
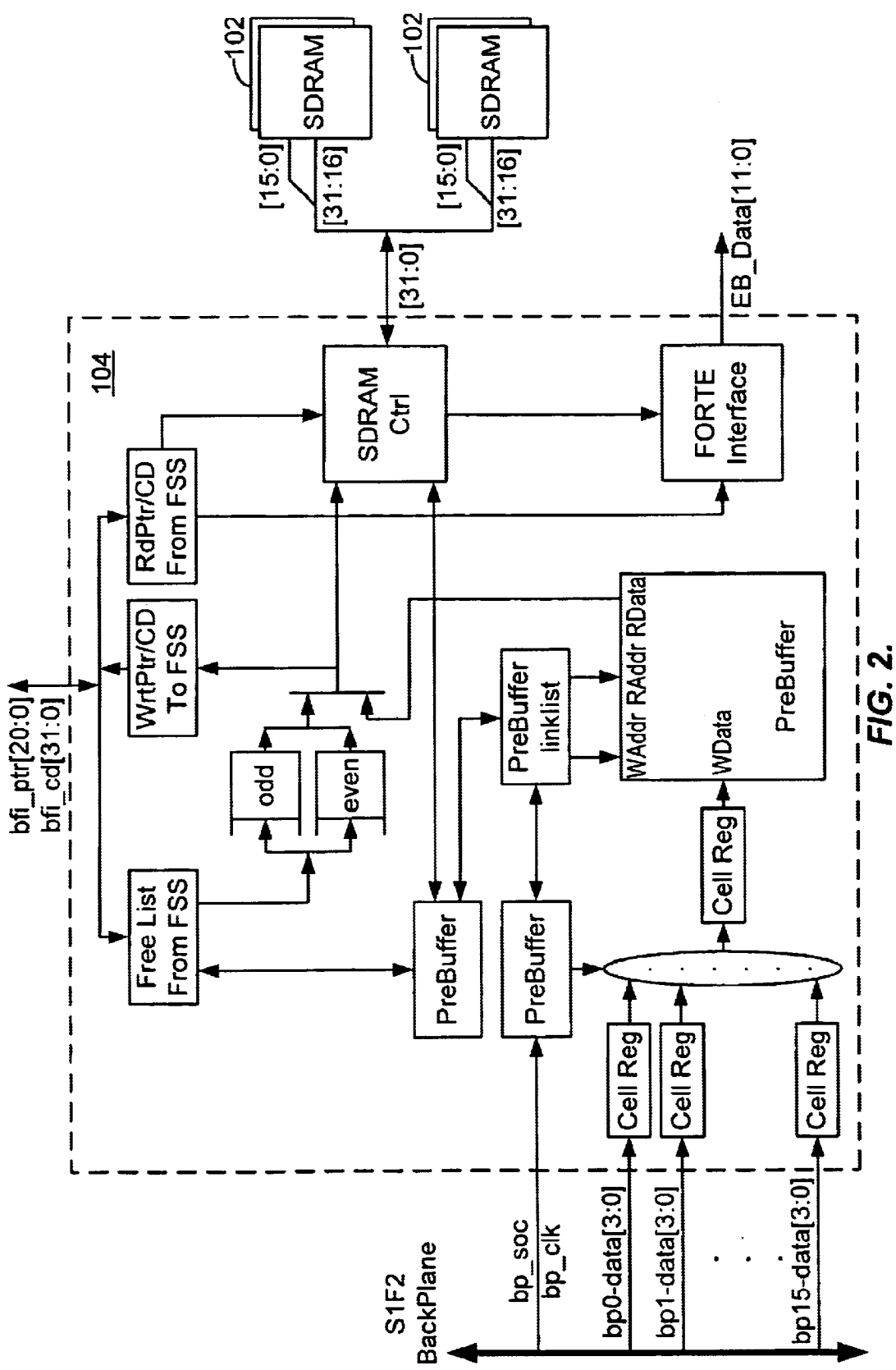
FIG. 2 is Bertie ASIC overview, in accordance with one embodiment of the present invention.

FIG. 2 is Bertie ASIC 104 overview, in accordance with one embodiment of the present invention. Bertie ASICs 104 are part of the Egress path for the Cell Data Path within the SIF2 system. Cell streams on the Egress path are travelling from the backplanes through the Bertie's, stored in the local cell buffer, and moving to the Forte ASIC.

As the cell streams are travelling from the Ingress path into the SIF2 back planes, while the synchronizing clocks are running at the 50 Mhz, cell data are travelling either at 50 or 100 Mhz, based on the system configuration. Therefore, within the backplane interface of Bertie, a 100 Mhz clock-recovery circuitry is provided for high sampling rate of the incoming data stream.

The peak burst rate for the incoming backplane buses are 8×2.5 Gbps=20 Gbps, and the interface between the Bertie's and the cell buffer is a 4×32=128-bit bi-directional bus running at 100 Mhz. The estimated throughput of the outgoing cell data from the local cell buffer is 22%×(128× 100 Mbps)=2.82Gbps. An on-chip prebuffer is located between the datapath of backplane interface and the local SDRAM cell buffer to smooth out the throughput difference. Based on the prebuffer modeling, a storage for 4K cells are allocated with the on-chip SDRAM to provide the optimal buffering scheme.

Once the cell data are stored in the local Bertie SDRAM, they will be stored temporarily until a read pointer is sent from the Filter to Bertie to indicate the flowing of the cell down to the Forte subsystem. At that time, a burst mode of SDRAM read will be issued by the Bertie to fetch the cell data and sending them through the unidirectional interface from Bertie to Forte on the preassigned time slots of the next NITS.

The density of the Bertie is reduced by the use of SDRAM. Rather than using static RAM, a method is provided by the present invention for combining SDRAM banks in to increase the density of the Bertie ASIC. Accordingly, the size of the Bertie ASIC is less would have been had static RAM been used. The corresponding real estate requirements of the Bertie ASIC on the mother board are, thus, reduced.

External Interfaces

Figure 3:
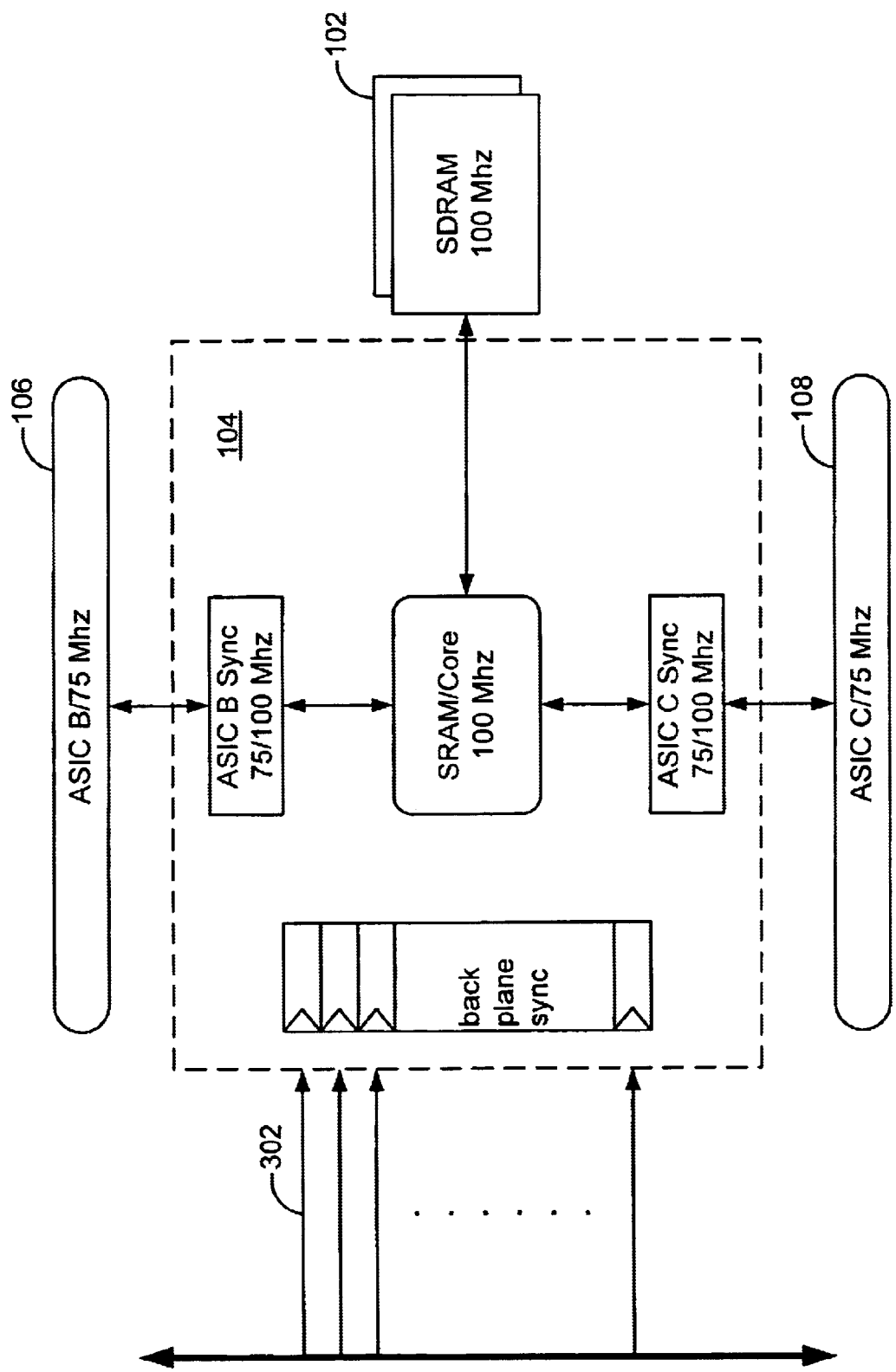
FIG. 3 is the partition of the Bertie in terms of the clock domains, in accordance with one embodiment of the present invention.

FIG. 3 is the partition of the Bertie 104 in terms of the clock domains, in accordance with one embodiment of the present invention. Each of the 16 incoming backplane bus to the Bertie 104 is running with its own synchronizing clock. The surrounding interface around each Bertie 104 contains components running at different speeds.

There are 16 backplane buses 302. Although the cell buffer logically is controlled by the Bertie ASICs, the management for the Free List of accessing the cell buffer is under the Cell Control Path inside the Trilogy. Four unidirectional bus between the Filter and Bertie is the pathway for passing information between the Bertie and Filter ASIC. Since Four Bertie's are working together in the bit-slice manner, the CD record for each cell are split among the individual 8-bit data bus between-each Bertie and the Filter. However, the each Bertie still requires the complete pointer value in order to fetch the bit-sliced data from the cell buffer.

To provide the high bandwidth required for the SIF2 data flow, Bertie ASIC's are equipped with high performance memory controller for the local 100 Mhz SDRAM-based cell buffer. The cell buffer can provide the storage of up to 1M cell, with each cell occupy 64 bytes of memory. Data bus between each Bertie and the corresponding 4 SDRAM devices is 32-bit wide with burst length of 4 data phase for each read/write access. Through the "BANKING" among SDRAM devices, 80% utilization of the bus bandwidth for data access is achievable.

Four Bertie ASIC's are working together to complete the data flow into/out of the cell buffer. Reception of the 4-bit slice data from part of the 16-bit back plane bus in the individual Bertie does not guarantee the successful reception of data for the other 4-bit slices. Therefore, communication between the 4 Bertie ASIC's on the same SIF2 require the interface among themselves to ensure the complete reception of the whole cell data from the 16-bit back plane bus.

Since an 1-bit bi-directional data bus is provided as the communication channel between the Bertie's for synchronization of cell collection for each backplane data bus, a total of 16-bit bi-directional bus into/out of each Bertie is required. The required data will time-multiplex the bus on the preassigned 100 Mhz clock cycle with the start of cell cycle for each incoming cell data as the reference point.

The 12-bit unidirectional bus from individual Bertie ASIC will constitute a data bus of 48-bit, with running speed of 75 Mhz, to provide the bandwidth of supplying 4 cell data from the Bertie cell buffer to Forte within each MTS.

Cell Buffer Organization

Figure 4:
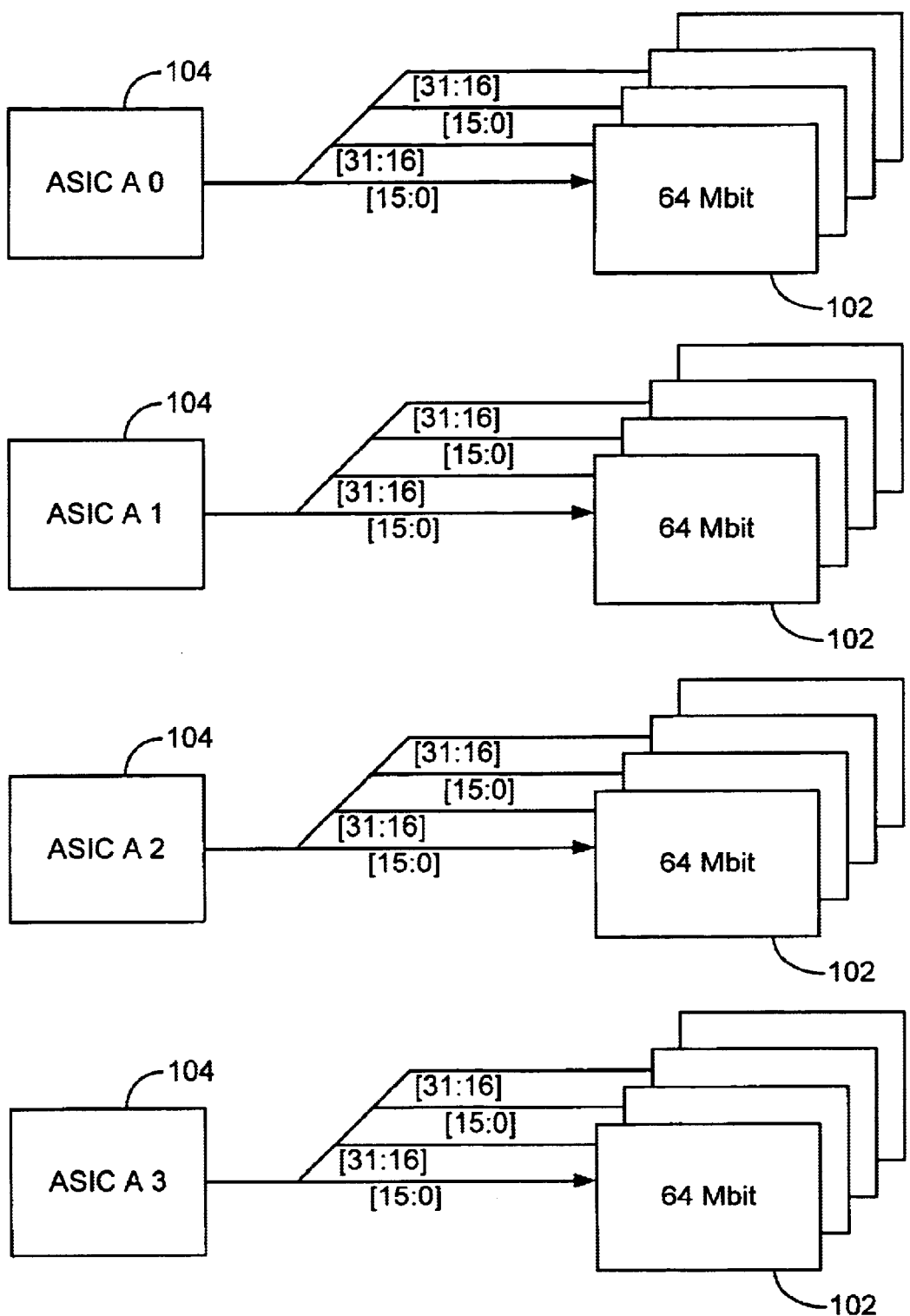
FIG. 4 shows cell buffers for 4 Bertie's, in accordance with one embodiment of the present invention.

FIG. 4 shows cell buffers for 4 Bertie's, in accordance with one embodiment of the present invention. Compared to conventional asynchronous DRAM technologies, the main advantage of SDRAM can be attributed to the synchronous operation, interleaving cell banks and burst mode access. For each Bertie, there are 4 SDRAM devices attached as the local cell buffer. Each SDRAM device is 64 Meg bit, with internal bank architecture of 1 Meg×16×4 and burst length of 4 for write/read access. Each SDRAM contains a 16-bit bi-directional data bus with running speed of 100 Mhz. From each Bertie's perspective, the local cell buffer would be a 2 bank organization, with 32-bit data access to each SDARM bank.

Figure 5:
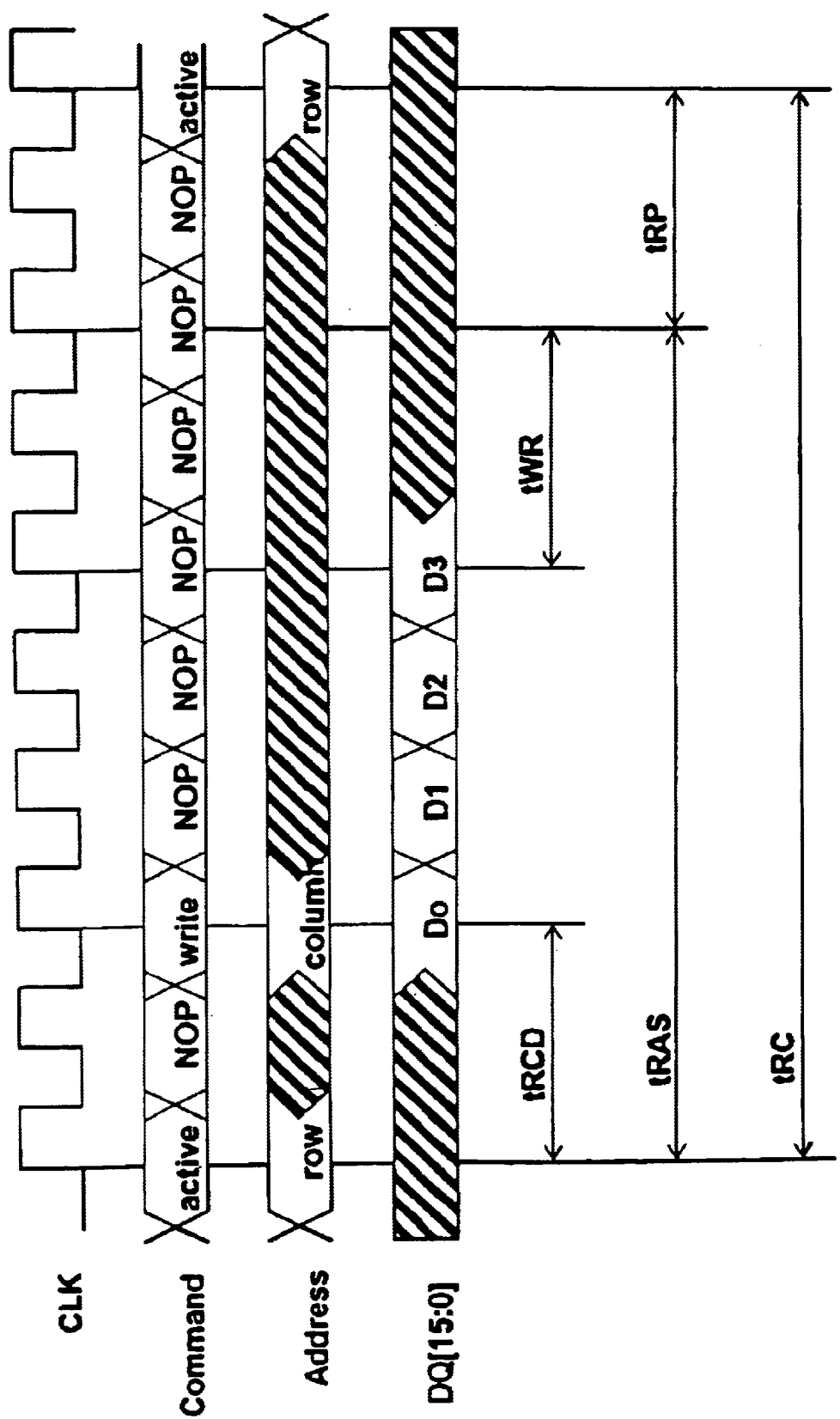
FIG. 5 illustrates one cycle write access to the SDRAM with auto precharge, in accordance with one embodiment of the present invention.

FIG. 5 illustrates one cycle write access to the SDRAM with auto precharge, in accordance with one embodiment of the present invention. The configuration used for write access to SDRAM in Bertie is given below in Table 1.

TABLE 1

Configuration Used For Write Access To Bertie

| Mode | Value |
| --- | --- |
| Burst type | Sequential |
| burst length | 4 |
| cas latency | 2 |
| auto precharge | Yes |

The parameters used for write operation is given below in Table 2.

TABLE 2

SDRAM Parameters For Write Operations With Auto Recharge

| Parameter | Value |
| --- | --- |
| TRAS | 60 nsec |
| TRC | 80 nsec |
| TRCD | 20 nsec |
| TWR | 20 nsec |
| TRP | 20 nsec |

During write access, based on the even/odd value of the pointer from the 12 entry free-list FIFO, even bank or odd bank will be written with cell data. To reduce turnover cycle required on the SDRAM bus, consecutive 4 write cycles will be issued to flush cell data from the prebuffer into cell buffer. After that, a turnover/refresh cycle will be issued by the SDRAM controller for necessary memory refresh and bus turnover. Then the read access to the SDRAM will start.

Figure 6:
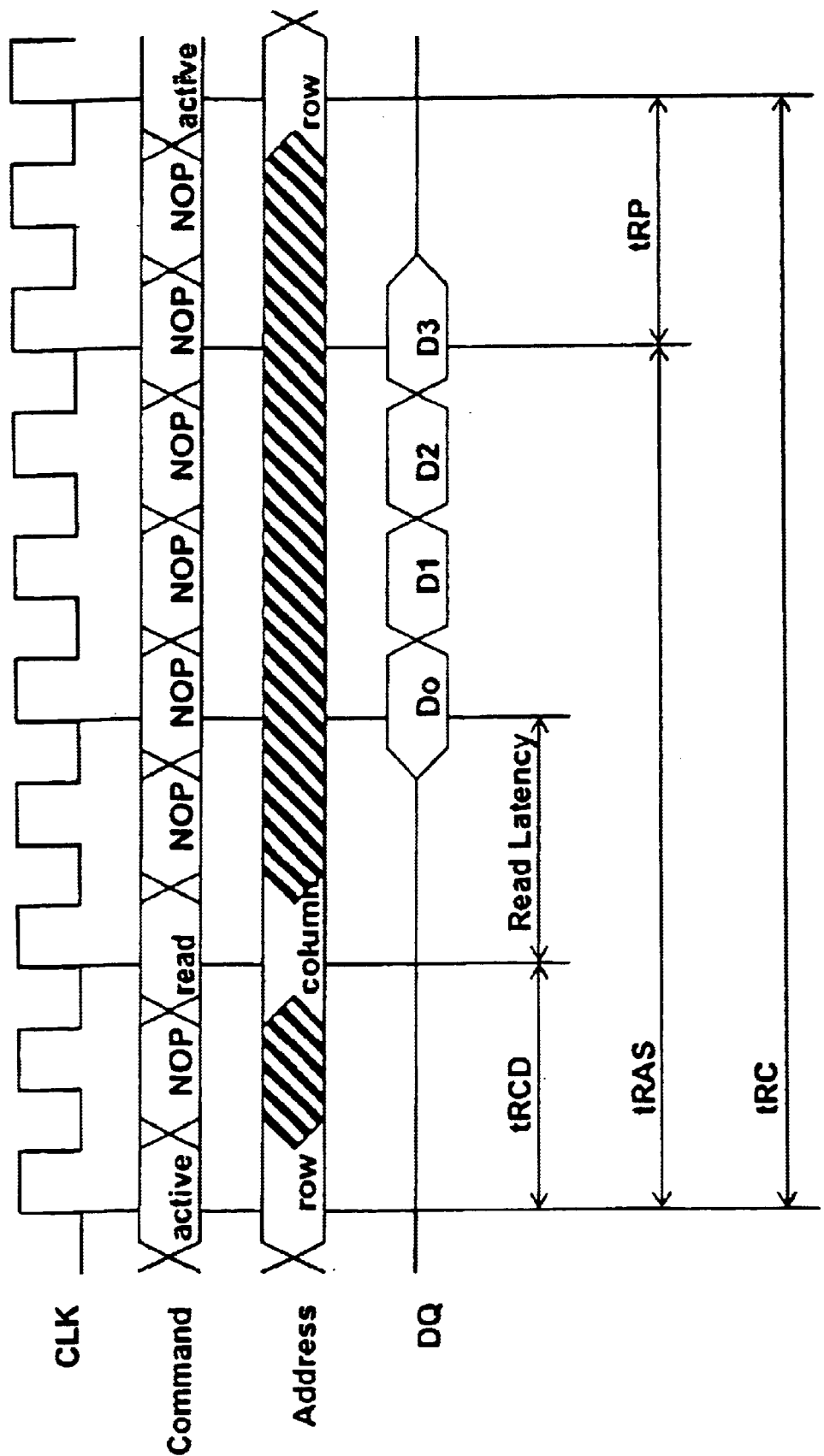
FIG. 6 illustrates one cycle of reading of the SDRAM with auto precharge, in accordance with one embodiment of the present invention.

FIG. 6 illustrates one cycle of reading of the SDRAM with auto precharge, in accordance with one embodiment of the present invention. Only four SDRAM read accesses will be issued within each MTS. To reduce turnover cycle on the data bus, the four read commands will also be issued in a back-to-back manner. With read latency of 2 and tRCD value of 20 ns, 8 cycles of 100 Mhz speed will be required for each read access. After the back-to-back read commands are retired with data fetch, another turnover/refresh cycle will be issued. And the whole write-turnover-read-turnover sequence will be repeated again for cell buffer interface.

After power up to the full Vcc level, an SDRAM device requires an initialization sequence, which includes cycles of precharge and refresh and configuration of the mode register before any valid command can be issued. Since different initialization sequences are required from individual vendors, the most conservative requirement will be observed. Configuration register is provided for the issue of the initialization sequence as well as the access to the contents of the memory array.

System and Method Implementation

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, micro-drive, and magneto-optical disks, ROMs, RAMS, EPROMs, EEPROMs, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/specialized computer or microprocessor are software modules for implementing the teachings of the present invention, including, but not limited to, writing data using a first set of SDRAM banks, and writing data using a second set of SDRAM banks, wherein the first set of SDRAM banks and the second set of SDRAM banks write interleaved, according to processes of the present invention.

in the foregoing specification, the invention has been described with reference to specific embodiments thereof. It will, however, be evident that various modifications and change may be made thereto without departing from the broader spirit and scope of the invention. The specification and drawings are, accordingly, to be regarded in an illustrative rather than a restrictive sense.

What is claimed is:

1. A method of using synchronous dynamic random access memory (SDRAM) to transmit data, the method comprising:

writing data using a first even addressed SDRAM bank;

writing data using a second even addressed SDRAM bank, wherein the first even addressed SDRAM bank and the second even addressed SDRAM bank write in parallel;

writing data using a first odd addressed SDRAM bank, wherein the first odd addressed SDRAM bank and the first even addressed SDRAM bank write interleaved; and writing data using a second odd addressed SDRAM bank, wherein the second odd addressed SDRAM bank and the first odd addressed SDRAM bank write in parallel, and wherein the second odd addressed SDRAM bank and the second even addressed SDRAM bank write interleaved.

2. The method of claim 1, wherein odd addressed SDRAM banks write interleaved with even addressed SDRAM banks.

3. The method of claim 1, further comprising:

reading data using the first even addressed SDRAM bank;

reading data using the first odd addressed SDRAM bank, wherein the first even addressed SDRAM bank and the first odd addressed SDRAM bank read in parallel;

reading data using the second even addressed SDRAM bank, wherein the second even addressed SDRAM bank and the first even addressed SDRAM bank read interleaved; and reading using the second odd addressed SDRAM bank, wherein the second odd addressed SDRAM bank and the second even addressed SDRAM bank read in parallel, and wherein the second odd addressed SDRAM bank and the first odd addressed SDRAM bank read interleaved.

4. The method of claim 3, wherein even addressed SDRAM banks read interleaved with even addressed SDRAM banks, and wherein odd addressed SDRAM banks read interleaved with odd addressed SDRAM banks.

5. The method of claim 3, wherein an amount of write operations is variable according to system requirements, and wherein an amount of read operations is variable according to system requirements.

6. The method of claim 1, wherein one writing operation takes between 5 and 8 clock cycles to complete.

7. The method of claim 1, further comprising:
    determining whether a selection pointer is even or odd; and
    selecting for a next operation either an odd addressed SDRAM bank or an even addressed SDRAM bank based on whether the selection pointer is even or odd.

8. The method of claim 1, wherein the first even addressed SDRAM bank and the second even addressed SDRAM bank share a common data bus, and wherein the first odd addressed SDRAM bank and the second odd addressed SDRAM bank share a common data bus.

9. An apparatus for transmitting data using synchronous dynamic random access memory (SDRAM), the apparatus comprising:
    a first even addressed SDRAM bank;
    a second even addressed SDRAM bank, wherein the first even addressed SDRAM bank and the second even addressed SDRAM bank are configured to write in parallel;
    a first odd addressed SDRAM bank, wherein the first add addressed SDRAM bank and the first even addressed SDRAM bank are configured to write interleaved; and
    a second odd addressed SDRAM bank, wherein the second odd addressed SDRAM bank and the first odd addressed SDRAM bank are configured to write in parallel, and wherein the second odd addressed SDRAM bank and the second even addressed SDRAM bank are configured to write interleaved.

10. The apparatus of claim 9, wherein each SDRAM bank is configured to read data, and wherein the first even addressed SDRAM bank and the first odd addressed SDRAM bank are configured to read in parallel, and wherein the second even addressed SDRAM bank and the first even addressed SDRAM bank are configured to read interleaved, and wherein the second odd addressed SDRAM bank and the second even addressed SDRAM bank are configured to read in parallel, and the second odd addressed SDRAM and the first odd addressed SDRAM bank are configured to read interleaved.

11. A computer readable medium carrying one or more sequences of one or more instructions for transmitting data using synchronous dynamic random access memory (SDRAM), the one or more sequences of one or more instructions including instructions which, when executed by one or more processors, cause the one or more processors to perform the steps of:
    writing data using a first even addressed SDRAM bank;
    writing data using a second even addressed SDRAM bank, wherein the first even addressed SDRAM bank and the second even addressed SDRAM bank write in parallel;
    writing data using a first odd addressed SDRAM bank, wherein the first odd addressed SDRAM bank and the first even addressed SDRAM bank write interleaved; and
    writing data using a second odd addressed SDRAM bank, wherein the second odd addressed SDRAM bank and the first odd addressed SDRAM bank write in parallel, and wherein the second odd addressed SDRAM bank and the second even addressed SDRAM bank write interleaved.

12. The computer readable medium of claim 11, wherein odd addressed SDRAM banks write interleaved with even addressed SDRAM banks.

13. The computer readable medium of claim 11, wherein the instructions further cause the processor to carry out the steps of:
    reading data using the first even addressed SDRAM bank;
    reading data using the first odd addressed SDRAM bank, wherein the first even addressed SDRAM bank and the first odd addressed SDRAM bank read in parallel;
    reading data using the second even addressed SDRAM bank, wherein the second even addressed SDRAM bank and the first even addressed SDRAM bank read interleaved; and
    reading using the second odd addressed SDRAM bank, wherein the second odd addressed SDRAM bank and the second even addressed SDRAM bank readin parallel, and wherein the second odd addressed SDRAM bank and the first odd addressed SDRAM bank read interleaved.

14. The computer readable medium of claim 13, wherein even addressed SDRAM banks read interleaved with even addressed SDRAM banks, and wherein odd addressed SDRAM banks read interleaved with odd addressed SDRAM banks.

15. The computer readable medium of claim 11, wherein the instructions further cause the processor to carry out the steps of:
    determining whether a selection pointer is even or odd; and
    selecting for a next operation either an odd addressed SDRAM bank or an even addressed SDRAM bank based on whether the selection pointer is even or odd.

16. The computer readable medium of claim 11, wherein one writing operation takes between 5 and 8 clock cycles to complete.

17. The computer readable medium of claim 11, wherein an amount of write operations is variable according to system requirements, and wherein an amount of read operations is variable according to system requirements.

18. The computer readable medium of claim 11, wherein the first even addressed SDRAM bank and the second even addressed SDRAM bank share a common data bus, and wherein the first odd addressed SDRAM bank and the second odd addressed SDRAM bank share a common data bus.

* * * * *